United States Patent [19]

Wong et al.

[11] Patent Number: 5,174,831
[45] Date of Patent: * Dec. 29, 1992

[54] SUPERCONDUCTOR AND PROCESS OF MANUFACTURE

[75] Inventors: James Wong, Wayland; Mark K. Rudziak, Westminister, both of Mass.

[73] Assignee: Composite Materials Technology, Inc., Shrewsbury, Mass.

[*] Notice: The portion of the term of this patent subsequent to Oct. 27, 2009 has been disclaimed.

[21] Appl. No.: 586,264

[22] Filed: Sep. 21, 1990

Related U.S. Application Data

[63] Continuation-in-part of Ser. No. 560,163, Jul. 31, 1990, Pat. No. 5,160,550, and a continuation-in-part of Ser. No. 540,193, Jun. 19, 1990, Pat. No. 5,160,794, and a continuation-in-part of Ser. No. 480,236, Feb. 15, 1990, Pat. No. 5,158,620, and a continuation-in-part of Ser. No. 363,634, Jun. 8, 1989, Pat. No. 4,925,741.

[51] Int. Cl.$^5$ .................. H01B 12/02; C22F 1/18
[52] U.S. Cl. ........................ 148/98; 505/919; 505/814; 29/599
[58] Field of Search ............. 428/930, 660, 661, 662, 428/610, 614; 148/11.5 Q, 11.5 F, 98; 29/599; 505/812, 813, 919, 921, 814

[56] References Cited

U.S. PATENT DOCUMENTS

| | | | |
|---|---|---|---|
| 3,218,643 | 11/1965 | Allen et al. | 428/930 |
| 3,465,430 | 9/1969 | Barber et al. | 29/599 |
| 3,534,459 | 10/1970 | Kudo et al. | 29/599 |
| 3,625,662 | 12/1972 | Roberts et al. | 428/610 |
| 3,652,967 | 3/1972 | Tanaka et al. | 505/879 |
| 3,665,595 | 5/1972 | Tanaka et al. | 29/599 |
| 3,728,165 | 4/1973 | Howlett | 148/127 |
| 4,803,310 | 2/1989 | Zeitlin et al. | 505/887 |
| 4,959,279 | 9/1990 | Tanaka et al. | 428/660 |
| 4,973,827 | 11/1990 | Smathers | 148/11.5 Q |

FOREIGN PATENT DOCUMENTS 45584  2/1982  European Pat. Off. ............ 428/930

Primary Examiner—John Zimmerman
Attorney, Agent, or Firm—Hayes, Soloway, Hennessey & Hage

[57] ABSTRACT

A high field superconductor is formed of an A-15 superconductor in the form of a layer thinner than 1000Å. This layer is carried by a support layer formed of a normal metal, the support layer having a thickness less than 1000Å.

3 Claims, 1 Drawing Sheet

SUPERCONDUCTOR AND PROCESS OF MANUFACTURE

This invention relates to the production of improved superconductors.

This application is a Continuation-in-Part of Ser. No. 560,163, filed Jul. 31, 1990, now U.S. Pat. No. 5,160,550, which is a Continuation-in-Part of Ser. No. 540,193, filed Jun. 19, 1990, now U.S. Pat. No. 5,160,794, which is a Continuation-in-Part of Ser. No. 480,236, filed Feb. 15, 1990, now U.S. Pat. No. 5,158,620, which is a Continuation-in-Part of Ser. No. 363,634, filed Jun 8, 1989, now U.S. Pat. No. 4,925,741. This disclosures of those application is incorporated herein in their entirety.

BACKGROUND OF THE INVENTION

In a preferred form of the invention described in the parent applications, a superconductor is produced by the steps of combining a plurality of layers of metal sheets to form a composite structure. The sheets are preferably pure transition metals—niobium, titanium, zirconium, or vanadium, for example—alternate sheets being formed of different transition metals. The resulting composite structure is mechanically reduced sufficiently so that each transition metal sheet is less than 1000 A° thick. In the course of reduction, the composite is subjected to sufficient temperatures for sufficient times such that the transition metal layers are partially reacted to form a ductile superconducting material between the transition metal layers.

Approximately one half by volume of the transition metal layers remain unreacted. These unreacted layers afford efficient flux pinning within the composite when the layers are reduced to the <1000 A° final size. In the fabrication of ternary (or higher order) alloys like NbTiTa, one or more of the transition metal layers is made relatively thin so as to allow complete diffusion through that region. However, at least one half by volume of one of the constituent transition metal layers remains pure or nearly pure after the reaction so as to provide pinning within the ternary composite when reduced to <1000 A° in thickness. In other embodiments, powders and filaments can be used instead of initial layers.

The present invention relates to the fabrication of wire containing layers of A15-type superconducting material, $Nb_3Sn$ and $Nb_3Al$, e.g. U.S. Pat. No. 3,218,693, held by National Research Coporation, describes a method for fabricating $Nb_3Sn$ conductors by assembling layers of niobium and tin, mechanically reducing the layer thicknesses by at least 98%, and then heating the product to form $Nb_3Sn$ layers. Excess Nb remains to provide mechanical support for the $Nb_3Sn$. While similar in many ways, the present invention involves much greater layer reduction than is called for in the NRC patent, and the superconducting material is formed during hot processing, not during a separate heat treatment. It should also be noted that the NRC inventors were clearly unaware of the flux pinning that normal/superconducting interfaces will provide when the layers of normal and superconducting material are <1000 A° thick. This principle is at the heart of the present invention.

The efficacy of artificial pinning for the A15 compound $Nb_3Sn$ was recently demonstrated by Gauss et al. (see, "$Nb_3Sn$ Multifilamentary Wires with composite Core Filaments", S. Gauss, W. Specking, F. Weiss, E. Seibt, J. Xu, and R. Flukiger, Advances in Cryogenic Engineering (Materials), vol 34, p. 843-849, Edited by A. F. Clark and R. P. Reed, Plenum Press, New York, 1988). This research showed that the incorporation of tantalum, titanium, or NbTi as pinning material in $Nb_3Sn$ can result in substantially higher $Nb_3Sn$ current density ($J_c$) as compared to conventionally fabricated "bronze-route" $Nb_3Sn$, where only grain boundaries are available as pinning sites. The composites produced by Gauss et al. were entirely unlike the layered composites typical of the present invention, but the same mechanisms are at work in both cases.

$Nb_3Al$ superconducting wires have been fabricated by a jellyroll method similar to that utilized in the application of the present invention (see, for example, "Experimental Result on $Nb_3Al$ Multifilamentary Wires", R. Bruzzese, N. Sacchetti, M. Spadoni, G. Barani, S. Ceresara, G. Donati, Proceedings of the Ninth International Conference on Magnet Technology, p. 557-559, Edited by C. Marinucci and P. Weymouth, Swiss Institute for Nuclear Research, Zurich, 1985). As in the case of the NRC $Nb_3Sn$ processing, the $Nb_3Al$ is formed in the composites during a special heat treatment given at the final wire size. It is one of the primary stengths of the present invention that such heat treatments are not required and, indeed, can result in poor $J_c$ due to degradation of the pinning layer purity.

BRIEF SUMMARY OF THE INVENTION

Aside from core materials, the multilayer composites described in the examples of the parent applications are composed solely of transition metals like niobium, titanium, and tantalum. Such composites are undoubtedly useful, but composites having superior superconducting properties can be fabricated if metals other than transition metals are utilized. Aluminum and tin, for example, are not transition metals, but they can be reacted with niobium in accordance with the invention to form composites incorporating the high-field superconductors $Nb_3Al$ and $Nb_3Sn$, respectively.

The preferred high field superconductors are $Nb_3Al$, $Nb_3Ga$, $Nb_3Ge$, $Nb_3Sn$, and $V_3Ga$, intermetallic compounds characterized by an A15 crystal structure and high upper critical fields (>10T). In accordance with the invention, these compounds are formed by the reaction of pure Nb or V with pure Al, Ga, Ge, or Sn, the exact combination being determined by the particular compound desired.

That non-transition metals are utilized instead of transition metals in no way affects the core principles of the invention. These principles can be briefly stated as follows:

1. A composite characterized by alternating layers of two or more metals.

2. Processing the composite at elevated temperatures in order to create, by diffusion, layers of superconducting material at the metal-to-metal interfaces of the composite, while also maintaining regions of undiffused metal.

3. Mechanically reducing the composite so that the diffused and undiffused layers are less than 1000 A in thickness.

The application of these principles to any appropriate combination of pure metals will result in the essential product of the invention, an artificially pinned superconducting composite.

BRIEF DESCRIPTION OF THE DRAWINGS

In order to more fully understand the invention, reference should be had to the following detailed description taken in conjunction with the attached drawings, wherein.

DETAILED DESCRIPTION OF THE INVENTION

In a preferred form of the parent invention, sheets of pure transition metal are layered and then wrapped around a core. When this material is processed, small layer thicknesses are quickly and easily obtained. During processing, ductile superconducting material is formed at the interfaces of the layered sheets such that approximately one half of the sheet thicknesses remain unreacted. These unreacted layers of transition metal afford pinning within the composite when reduced to <1000 A° thick. The presence of pinning sites in the composite allows the development of superior $J_c$ at low magnetic field (1T-5T). Here, a pinning site is defined as an interface between normal and superconducting material. In general, the greater the pinning site density within the composite, the better the low field $J_c$.

The thickness of the normal and superconducting layers is critical to the ultimate performance of the composite. If the layer thicknesses are too large, i.e., not on the order of the fluxoid spacing at the particular magnetic field, then inefficient pinning results. On the other hand, if the layers are reduced too much, mechanical and diffusional problems are introduced, as are proximity effects, serving to degrade the critical current density and upper critical field of the composite.

A15 superconductors like $Nb_3Al$ and $Nb_3Sn$ involve metals other than transition metals, but they offer higher upper critical fields ($H_{c2}$'s) than many of the transition metal alloys. This makes the A15 materials desirable for applications demanding substantial current densities at high (>10T) operating magnetic fields. Unfortunately, A15 materials tend to be brittle, and so are not well suited to wire fabrication. The application of the invention to A15 compounds permits the fabrication of wires incorporating these compounds. The wires are ductile and relatively flexible. Although the specific mechanism is not well understood, it is suspected that deformation of these composites is possible because the superconducting layers are very thin (<1 μm) and are crystallographically oriented to the base metal (niobium, e.g.).

According to the invention, a composite material utilizing alternating layers of a transition metal and a non-transition metal can be fabricated as described in the following non-limiting example:

EXAMPLE I

Figure 1:
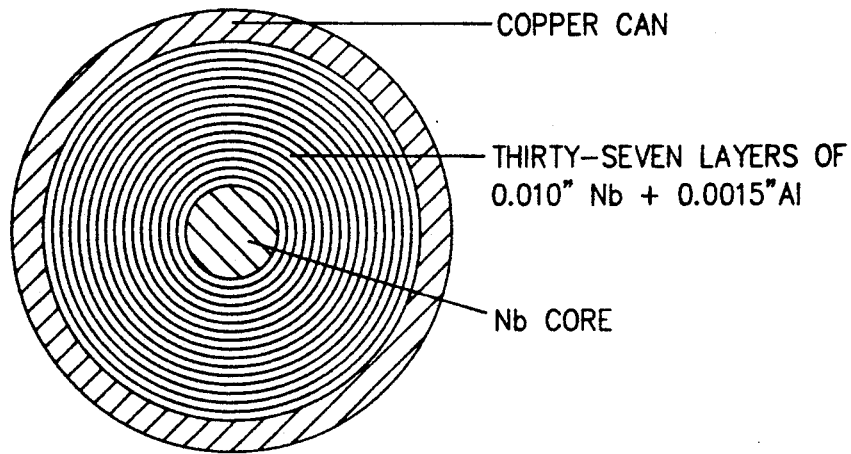
FIG. 1 is a schematic diagram of a monofilament billet containing sheets of niobium and aluminum wrapped around a niobium core.

A monofilament billet is constructed by first wrapping an assembly of 6.00" wide sheets around a niobium core (see FIG. 1). The sheet assembly consists of 0.0015" thick aluminum +0.010" thick niobium. These thicknesses are chosen so that when one half of the niobium by volume and all of the aluminum are reacted, nearly stoichiometric $Nb_3Al$ is formed. The wrapped sheets and the core are inserted into a copper can and a nose and tail are attached by electron beam welding in vacuum. The completed billet is cold swaged at an areal reduction rate of 20% per pass to a diameter of 0.50".

The 0.50" rod is cropped to remove the excess copper at the nose and tail and is then cold drawn at a 20% reduction rate to 0.030" final diameter. "Cold" here should be taken to mean room temperature. The monofilament billet must not be processed at high temperatures, since this may result in both premature niobium/aluminum intermetallic formation and non-uniform reduction of the niobium and aluminum layers due to the desparity in their hardness.

Figure 2:
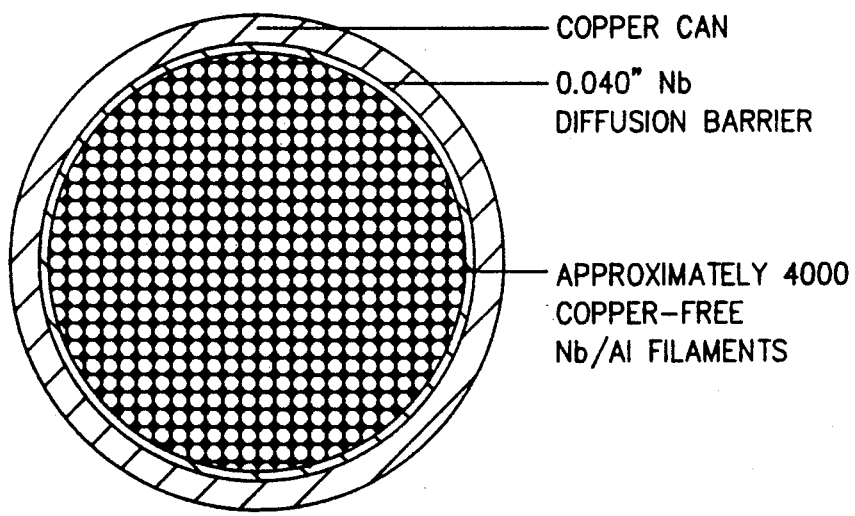
FIG. 2 is a schematic diagram of a restack billet containing copper-free niobium/aluminum filaments.

The 0.030" wire is staightened and cut into 5.0" lengths. The copper is pickled off of these filaments in a nitric acid solution, after which the restack billet having the design shown in FIG. 2 is assembled. The nose and tail of the billet are electron beam welded to the can in vacuum, after which the billet is hot isostatically pressed (HIP'd) at 500° C., 15 ksi for 4 hours. The billet is then machined to 2.0" in diameter, preheated for 2 hours at 550° C., and finally extruded at 550° C. to 0.50" in diameter. The extrusion is water quenched. In the course of this hot processing, the thin (<1 μm at restack size) aluminum layers are converted to superconducting $Nb_3Al$. Because the layers are so thin, it is possible to draw the composite, even though $Nb_3Al$ is an intrinsically brittle material. After cropping, the extrusion is drawn down at an areal reduction rate of 20% per die pass to approximately 0.015" in diameter, where approximately 0.015" in diameter, where the niobium layers are less than 1000 A° thick and so serve to pin the composite.

A $Nb_3Sn$ composite can be fabricated in the same way as this $Nb_3Al$ composite, with pure tin foil being utilized in place of aluminum foil.

In order to facilitate the co-processing of relatively hard metals like niobium with softer metals like aluminum or tin, it may be desirable to bond the metals prior to assembly of the monofilament. As anyone knowledgeable in the art will understand, the bonding of sheet materials like niobium and tin can be achieved by stacking the sheets and then repeatedly rolling the stack at large (>10%) reduction. Sputtering and chemical deposition are other methods by which a layer of one metal can be applied to the surface of another. The sheet that results from such operations can be wound around a core for incorporation in a monofilament billet. This billet is subsequently processed as described above.

We claim:

1. The process of forming a high field A-15 intermetallic compound which comprises the steps of combining and then coreducing a layer of first metal from the group consisting of Al, Ga, Ge, and Sn with a layer of a second metal from the group consisting of Nb and V, said coreduction being carried out at a temperature below the temperature of reaction of said two metals until the first metal layer is less than 1 μm, then heating said coreduced layers to a temperature to react all of said first metal with said second metal to form a thin layer (less than 1 μm) of said A-15 compound, the amount of second metal being greater than that necessary to react with all of the first metal, limiting the extent of the reaction so as to limit the thickness of pure or nearly pure unreacted second metal so that it is about equal to the thickness of the compound layer whereby unreacted second metal layer remains in contact with said A-15 compound layer, thereafter reducing the composite second metal and A-15 compound layers until each said layer is less than 1000 A° thick.

2. The process of claim 1 wherein the first metal is Al and the second metal is Nb.

3. The process of claim 1 wherein the first metal is Sn and the second metal is Nb.

* * * * *